US008493130B2

(12) United States Patent
Fukazawa et al.

(10) Patent No.: US 8,493,130 B2
(45) Date of Patent: Jul. 23, 2013

(54) REFERENCE VOLTAGE GENERATING CIRCUIT

(75) Inventors: Mitsuya Fukazawa, Kanagawa (JP); Kenji Furusawa, Kanagawa (JP); Masao Ito, Kanagawa (JP); Naoko Uchida, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 13/553,595

(22) Filed: Jul. 19, 2012

(65) Prior Publication Data

US 2013/0033305 A1 Feb. 7, 2013

(30) Foreign Application Priority Data

Aug. 2, 2011 (JP) ................................ 2011-169388

(51) Int. Cl.
*H01L 35/00* (2006.01)
*H01L 37/00* (2006.01)
*H03K 3/42* (2006.01)
*H03K 17/78* (2006.01)

(52) U.S. Cl.
USPC ............................ 327/513; 327/539; 327/540

(58) Field of Classification Search
USPC .......................... 327/512, 513, 538–541, 543
See application file for complete search history.

(56) References Cited

U.S. PATENT DOCUMENTS 5,767,664 A * 6/1998 Price ............................ 323/313
7,420,359 B1 9/2008 Anderson et al.
2011/0187441 A1 * 8/2011 Zimlich ........................ 327/513

* cited by examiner

*Primary Examiner* — Quan Tra
(74) *Attorney, Agent, or Firm* — McDermott Will & Emery

(57) ABSTRACT

A reference voltage generating circuit that accurately corrects temperature characteristics of a BGR (bandgap reference) circuit and a regulator. A voltage dividing circuit outputs first and second voltages obtained by dividing a BGR voltage. The regulator includes a differential amplifier, first and second resisters coupled in series between the output terminal of the differential amplifier and the ground. The positive input terminal of the differential amplifier receives the BGR voltage, and the negative input terminal is coupled to a coupled node between third and fourth resistors. The BGR circuit outputs a third voltage varying with a temperature determined by a predetermined amount of current flowing in the BGR circuit and a predetermined resistor. A temperature-characteristics correcting circuit controls a correcting current flowing through the coupled node so that its magnitude varies with the difference between the first and third voltages, and the difference between the second and third voltages.

8 Claims, 10 Drawing Sheets

REFERENCE VOLTAGE GENERATING CIRCUIT

CROSS-REFERENCE TO RELATED APPLICATIONS

The disclosure of Japanese Patent Application No. 2011-169388 filed on Aug. 2, 2011 including the specification, drawings and abstract is incorporated herein by reference in its entirety.

BACKGROUND

The present invention relates to reference voltage generating circuits.

In order to achieve highly accurate semiconductor circuits, especially in order to achieve highly accurate semiconductor analog circuits, reference voltage generating circuits that have extremely small variations in reference voltages to temperature change are needed.

In order to meet the above needs, a reference voltage generating circuit that has the following function is disclosed in U.S. Pat. No. 7,420,359.

A voltage that is proportional to the absolute temperature obtained from a resistor coupled to a BGR (bandgap reference) circuit, and voltages obtained by dividing the output voltage of the BGR circuit are input into a correcting circuit including a differential pair. The differential pair of the correcting circuit generates a correcting current in accordance with the difference between the input voltages that varies in accordance with temperature. By making the generated correcting current flow through a resistor coupled to the BGR circuit, the reference voltages, which are output from the BGR circuit and vary depending on temperature change, are corrected.

SUMMARY

In U.S. Pat. No. 7,420,359, however, the voltages obtained from the BGR circuit become voltages input into the correcting circuit. The correcting circuit generates the correcting current in accordance with the difference between the input voltages, and feeds the correcting current back to the resistor coupled to the BGR circuit.

In this case, the input voltages input into the correcting circuit vary in accordance with the correcting current that is fed back. The correcting current varies accordingly, with the result that it becomes difficult to obtain a desired corrected result.

In addition, only the temperature characteristics of the BGR circuit is corrected in U.S. Pat. No. 7,420,359. Therefore, if a regulator is set up in a latter stage in a reference voltage generating circuit, the temperature characteristics of the regulator is not corrected.

Therefore, a primary objective of the present invention is to provide a reference voltage generating circuit that can accurately correct the temperature characteristics of a BGR circuit and a regulator.

A reference voltage generating circuit according to an embodiment of the present invention includes: a bandgap reference circuit that outputs a bandgap reference voltage; a voltage dividing circuit that generates a first voltage and a second voltage obtained by dividing the bandgap reference voltage; and a regulator that amplifies the bandgap reference voltage. The regulator includes a differential amplifier, a first resistor and a second resistor that are coupled in series between the output of the differential amplifier and the ground. A first input terminal of the differential amplifier receives the bandgap reference voltage and a second input terminal is coupled to a coupled node between the first resister and the second resistor. The bandgap reference circuit further outputs a third voltage that varies in accordance with the temperature determined by a predetermined amount of current flowing in the bandgap reference circuit and a predetermined resistor in the bandgap reference circuit. The reference voltage generating circuit further includes a correcting circuit that controls a correcting current flowing through the coupled node so that the magnitude of the correcting current varies in accordance with the difference between the third voltage and the first voltage, and the difference between the third voltage and the second voltage.

In other words, the reference voltage generating circuit according to this embodiment of the present invention can accurately correct the temperature characteristics of the BGR circuit and the regulator.

DETAILED DESCRIPTION

Hereinafter, embodiments of the present invention will be described with reference to the accompanying drawings.

First Embodiment

Figure 1:
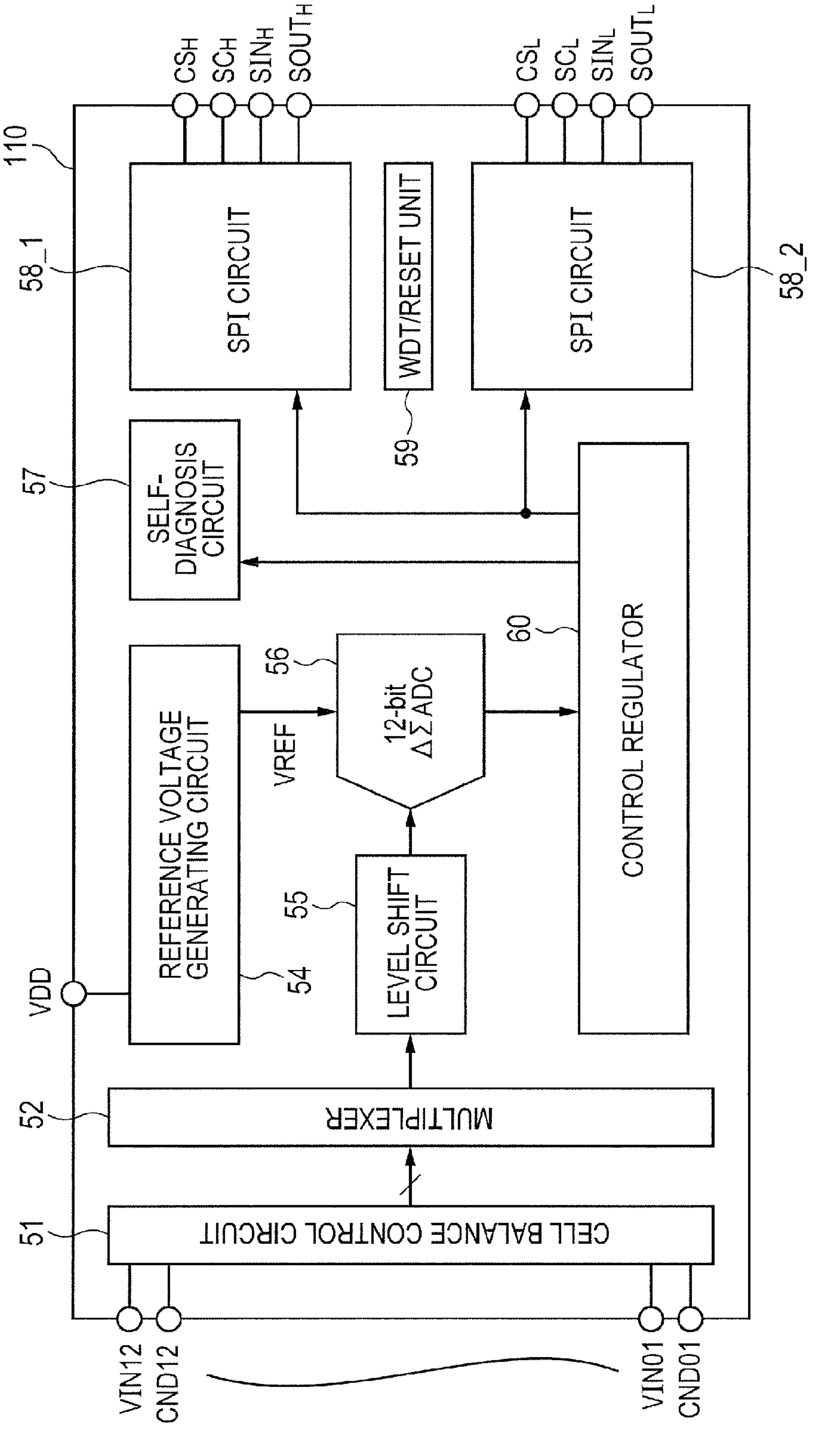
FIG. 1 is a diagram showing the configuration of a semiconductor apparatus according to an embodiment of the present invention.

FIG. 1 is a diagram showing the configuration of a semiconductor apparatus according to an embodiment of the present invention.

In FIG. 1, this semiconductor apparatus, which is used for monitoring batteries, includes a cell balance control circuit 51, a multiplexer 52, a reference voltage generating circuit 54, a self-diagnosis circuit 57, a level shift circuit 55, a 12-bit ΔΣADC 56, SPI (serial peripheral interface) circuits 58_1 and 58_2, a WDT/Reset unit 59, and a control register 60.

The cell balance circuit 51 receives voltages of a large number of batteries coupled in series, that is, voltages VIN01 to VIN12 and voltages CIN0 to CIN12, and controls charging up the batteries so that the nonuniformity among charges of the batteries resulted from discharging may be corrected.

The multiplexer 52 selects one output out of twelve outputs from the cell balance control circuit 51, and outputs the selected output.

The level shift circuit 55 shifts the level of a voltage provided for the 12-bit ΔΣADC 56.

The reference voltage generating circuit 54 provides a highly accurate reference voltage VREF for the 12-bit ΔΣADC 56.

The 12-bit ΔΣADC 56 calculates the differences (Δ) between analog voltages and signals obtained by D/A (digital-to-analog) converting and integrating digital outputs, and integrates (Σ) the differences to obtain a signal, and compares the signal with the reference voltage, and sends a 12-bit value obtained by quantizing the difference between the signal and the reference voltage to the control register 60.

The self-diagnosis circuit 57 checks abnormalities concerning the battery voltages VIN01 to VIN12 and CIN0 to CIN12.

The SPI circuits 58_1 and 58_2 control other ICs (integrated circuits) on the basis of the output values from the 12-bit ΔΣADC 56 in the control register 60.

The WDT/Reset unit 59 executes a watch dog timer function and a reset function. In the apparatus shown in FIG. 1, because the reference voltage generating circuit 54 provides the highly accurate reference voltage VREF for the 12-bit ΔΣADC 56, highly accurate monitoring of the batteries can be performed.

(Outline of Reference Voltage Generating Circuit)

Figure 2:
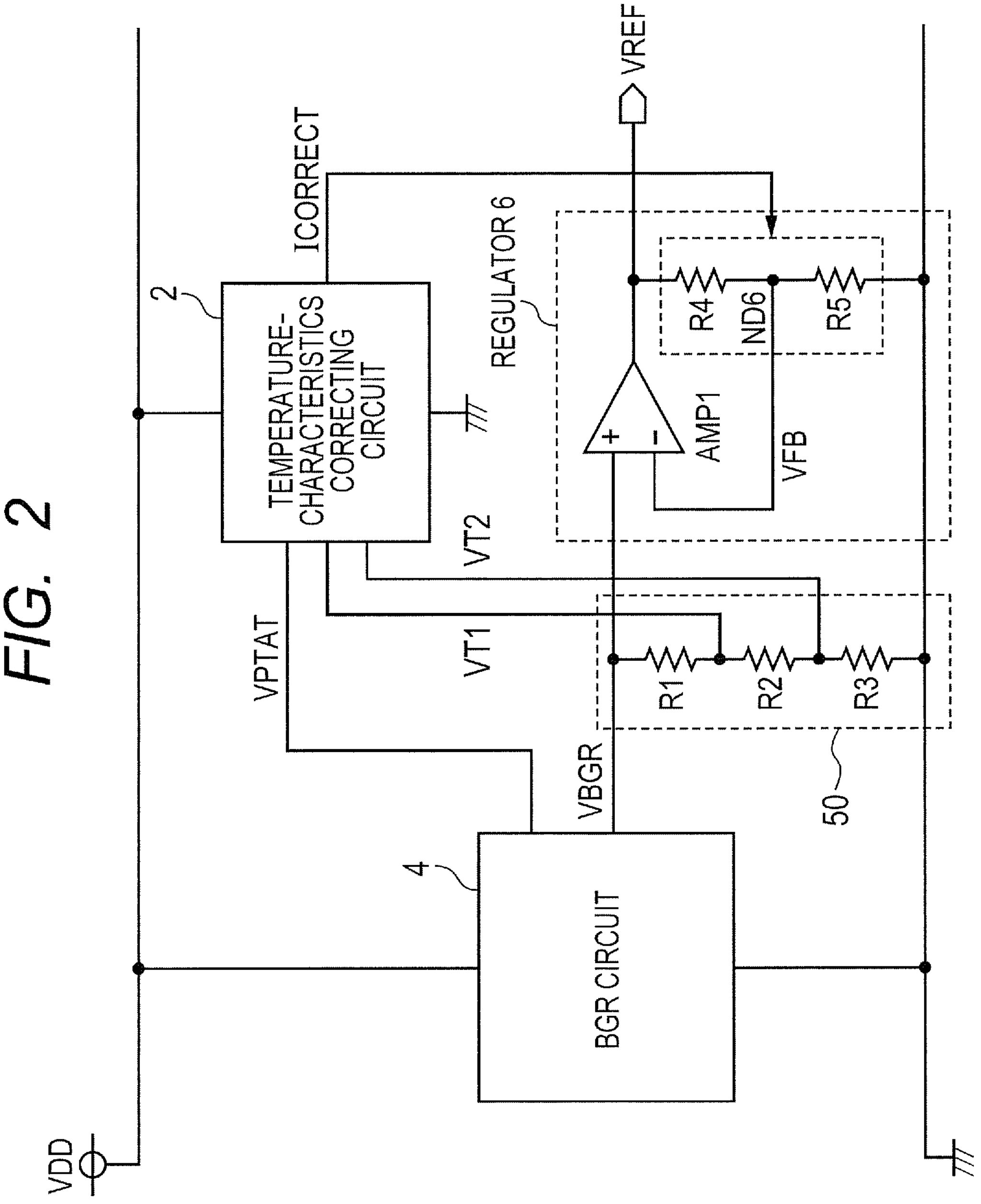
FIG. 2 is a diagram showing the configuration of a reference voltage generating circuit according to the embodiment of the present invention.

FIG. 2 is a diagram showing the configuration of the reference voltage generating circuit according to the embodiment of the present invention.

As shown in FIG. 2, the reference voltage generating circuit includes a BGR circuit 4, a voltage dividing circuit 50, a regulator 6, and a temperature-characteristics correcting circuit 2.

The BGR circuit 4 outputs a bandgap reference voltage VBGR. The bandgap reference voltage VBGR slightly varies within several millivolts in accordance with temperature. The reference voltage VREF output from the regulator 6 also varies in accordance with the temperature change of the bandgap reference voltage VBGR and the temperature characteristics of the regulator itself. The primary objective of this embodiment is to prevent the reference voltage VREF from varying in accordance with temperature change.

The BGR circuit 4 outputs a voltage VPTAT that widely varies in accordance with the temperature determined by a predetermined amount of current flowing in the BGR circuit 4 and a predetermined resistor in the BGR circuit 4.

The voltage dividing circuit 50 generates a higher voltage VT1 and a lower voltage VT2 that are obtained by dividing the bandgap reference voltage VBGR. The voltage VT1, the voltage VT2, and the bandgap reference voltage VBGR slightly vary within several millivolts in accordance with temperature.

The regulator 6 amplifies the bandgap reference voltage VBGR, and outputs the reference voltage VREF. The regulator 6 includes a differential amplifier AMP1 and a resistor R4 and a resistor R5 coupled in series between the output terminal of the differential amplifier AMP1 and the ground.

The positive input terminal of the amplifier AMP1 receives the bandgap reference voltage VBGR, and the negative input terminal is coupled to a coupled node ND6 between the resistor R4 and the resistor R5.

The temperature-characteristics correcting circuit 2 controls a correcting current ICORRECT flowing through the coupled node ND6 so that the magnitude of the correcting current ICORRECT varies in accordance with the difference between the voltage VPTAT and the voltage VT1, and the difference between the voltage VPTAT and the voltage VT2.

In this embodiment, the correcting current ICORRECT generated by the temperature-characteristics correcting circuit 2 in accordance with the voltage VPTAT, which varies depending on the temperature in the BGR circuit 4, is fed back into the regulator 6, with the result that the voltage VPTAT, the voltage VT1, and the voltage VT2, which are all input into the temperature-characteristics correcting circuit 2, can be made not to vary in accordance with the correcting current ICORRECT. As a result, it becomes easier to obtain the correcting current of a desired value. In addition, because not only the BGR circuit 4 but also the regulator 6 are targeted for the correction, the correction in which the temperature characteristics of the regulator 6 is taken into consideration can be achieved.

(Detail of Reference Voltage Generating Circuit)

Figure 3:
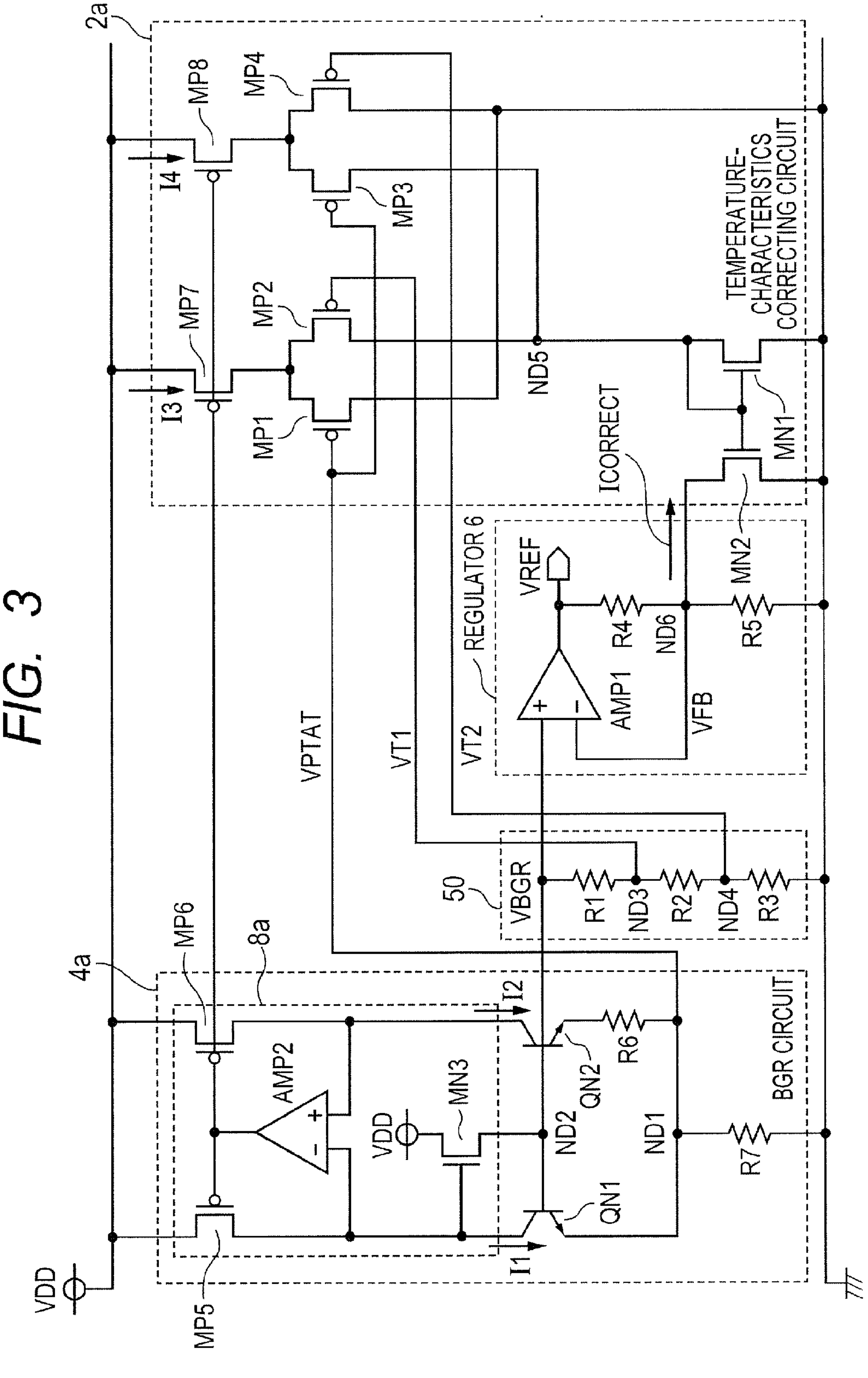
FIG. 3 is a diagram showing the configuration of a reference voltage generating circuit according to a first embodiment.

FIG. 3 is a diagram showing the configuration of the reference voltage generating circuit according to a first embodiment.

As shown in FIG. 3, a BGR circuit 4*a* includes a current source 8*a*, NPN bipolar transistors QN1 and QN2, and resistors R6 and R7.

The current source 8*a* outputs a current I1 and a current I2 that have the same value.

The current source 8*a* includes PMOS transistors MP5 and MP6, a feedback amplifier AMP2, and an NMOS transistor MN3.

The PMOS transistors MP5 and MP6 form a current mirror circuit. The source of the PMOS transistor MP5 and the source of the PMOS transistor MP6 are coupled to the power supply voltage VDD. The drain of the PMOS transistor MP5 is coupled to the collector terminal of the bipolar transistor QN1. The drain of the PMOS transistor MP6 is coupled to the collector terminal of the bipolar transistor QN2.

The positive input terminal of the amplifier AMP2 is coupled to the drain of the PMOS transistor MP6 and the collector terminal of the bipolar transistor QN2. The negative input terminal of the amplifier AMP2 is coupled to the drain of the PMOS transistor MP5 and the collector terminal of the bipolar transistor QN1. The output terminal of the amplifier AMP2 is coupled to the gate of the PMOS transistor MP5 and the gate of the PMOS transistor MP6.

Because the size of the PMOS transistor MP5 and the size of the PMOS transistor MP6 is equal to each other, the current I1 sent to the bipolar transistor QN1 from the current source 8*a* and the current I2 sent to the bipolar transistor QN2 from the current source 8*a* is made to be equal to each other owing to the function of the amplifier AMP2.

The NMOS transistor MN3 is disposed between the power supply voltage VDD and a node ND2. The node ND2 is a node to which the base terminal of the bipolar transistor QN1 and the base terminal of the bipolar transistor QN2 are coupled. The gate of the NMOS transistor MN3 is coupled to the drain of the PMOS transistor MP5 and the collector terminal of the bipolar transistor QN1.

The collector terminal of the bipolar transistor QN1 is coupled to the drain of the PMOS transistor MP5, and the current I1 is input into the collector terminal of the bipolar transistor QN1.

The base terminal of the bipolar transistor QN1 is coupled to the node ND2, and the emitter terminal is coupled to a node ND1.

The collector terminal of the bipolar transistor QN2 is coupled to the drain of the PMOS transistor MP6, and the current I2 is input into the collector terminal of the bipolar transistor QN2.

The base terminal of the bipolar transistor QN2 is coupled to the node ND2, and the emitter terminal is coupled to one terminal of the resistor R6.

As mentioned above, the one terminal of the resistor R6 is coupled to the emitter terminal of the bipolar transistor QN2, while the other terminal is coupled to the node ND1.

The resistor R7 is disposed between the node ND1 and the ground. The node ND2, to which the base terminal of the bipolar transistor QN1 and the base terminal of the bipolar transistor QN2 are coupled, outputs the bandgap reference voltage VBGR.

The node ND1, to which the emitter terminal of the bipolar transistor QN1, the resistor R6, and the resistor R7 are coupled, outputs the voltage VPTAT, which linearly varies to temperature, to a temperature-characteristics correcting circuit 2*a*. The voltage VPTAT is determined by the sum of the currents I1 and I2, and the resistor R7, and varies in accordance with temperature.

(Voltage Dividing Circuit)

The voltage dividing circuit 50 includes resistors R1, R2, and R3 disposed in series between the node ND2 and the ground. A coupled node ND3, to which the resistor R1 and the resistor R2 are coupled, outputs the higher voltage VT1 that is nearly constant to temperature change. A coupled node ND4, to which the resistor R2 and the resistor R3 are coupled, outputs the lower voltage VT2 that is nearly constant to temperature change.

(Regulator)

The regulator 6 includes the differential amplifier AMP1, and the resistors R4 and R5 used for dividing the voltage VREF at the output terminal of the differential amplifier AMP1.

The resistors R4 and R5 are disposed in series between the output terminal of the differential amplifier AMP1 and the ground. The coupled node ND6 between the resistor R4 and the resistor R5 is coupled to the negative input terminal of the differential amplifier AMP1 and the drain of an NMOS transistor MN2 at the output side of a current mirror circuit. The positive input terminal of the differential amplifier AMP1 is coupled to the node ND2, and receives the bandgap reference voltage VBGR, while the negative input terminal is coupled to the node ND6, and receives the feedback voltage VFB. The output terminal of the amplifier AMP1 outputs the reference voltage VREF.

(Temperature-Characteristics Correcting Circuit)

The temperature-characteristics correcting circuit 2*a* includes PMOS transistors MP7 and MP8, PMOS transistors MP1 and MP2 that form a first differential pair, PMOS transistors MP3 and MP4 that form a second differential pair, and NMOS transistors MN1 and MN2 that form a current mirror circuit.

The PMOS transistor MP7, as well as the PMOS transistor MP6, forms a current mirror circuit, and becomes a current source that outputs a tail current I3.

The PMOS transistor MP8, as well as the PMOS transistor MP6, forms a current mirror circuit, and becomes a current source that outputs a tail current I4.

The gate of the PMOS transistor MP1 and the gate of the PMOS transistor MP3 receive the voltage VPTAT that linearly varies to temperature.

The gate of the PMOS transistor MP2 receives the high voltage VT1 that does not vary much in accordance with temperature. The gate of the PMOS transistor MP4 receives the low voltage VT2 that does not vary much in accordance with temperature.

The source of the PMOS transistor MP1 and the source of the PMOS transistor MP2 are coupled to the drain of the PMOS transistor MP7 that is a current source. The source of the PMOS transistor MP3 and the source of the PMOS transistor MP4 are coupled to the drain of the PMOS transistor MP8 that is a current source.

The drain of the PMOS transistor MP1 and the source of the PMOS transistor MP4 are coupled to the ground. The drain of the PMOS transistor MP1 and the source of the PMOS transistor MP4 are coupled to a node ND5.

The drain and gate of the NMOS transistor MN1 at the input side of the current mirror circuit are coupled to the node ND5. The source of the NMOS transistor MN1 is coupled to the ground.

The drain of the NMOS transistor MN2 at the output side of the current mirror circuit is coupled to the node ND6. The source of the NMOS transistor MN2 is coupled to the ground and the gate is coupled to the node ND5.

The correcting current ICORRECT that flows from the node ND 6 to the ground via the NMOS transistor MN2 at the output side of the current mirror circuit makes it possible to correct the voltage VREF in accordance with the magnitude of the correcting current ICORRECT.

(AMP1)

Figure 4:
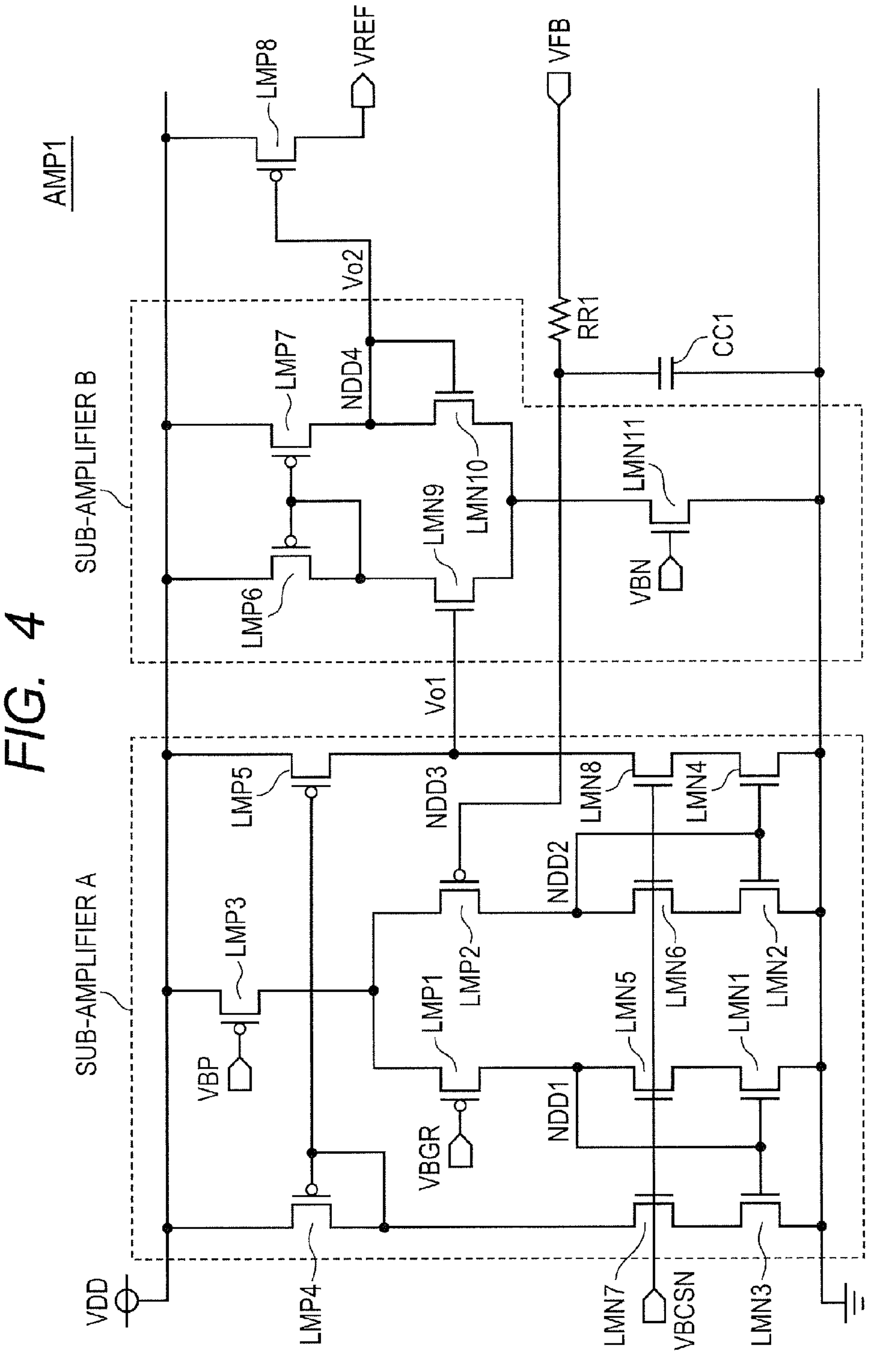
FIG. 4 is a diagram showing the configuration of a differential amplifier shown in FIG. 3.

FIG. 4 is a diagram showing the configuration of the differential amplifier AMP1 shown in FIG. 3.

As shown in FIG. 4, the differential amplifier AMP1 includes a sub-amplifier A, a sub-amplifier B, and a PMOS transistor LMP8.

The sub-amplifier A includes PMOS transistors LMP1 and LMP2 that form an input differential pair, a PMOS transistor LMP3 that forms a tail current source, and PMOS transistors LMP4 and LMP5 that form loads.

The sub-amplifier A further includes NMOS transistors LMN7 and LMN3 that are disposed in series between the drain of the PMOS transistor LMP4 and the ground, and NMOS transistors LMN8 and LMN4 that are disposed in series between the drain of the PMOS transistor LMP5 and the ground.

The sub-amplifier A further includes NMOS transistors LMN5 and LMN1 that are disposed in series between the drain of the PMOS transistors LMP1 and the ground, and NMOS transistors LMN6 and LMN2 that are disposed in series between the drain of the PMOS transistors LMP2 and the ground.

A constant bias voltage VBP is input into the gate of the PMOS transistor LMP3. A constant bias voltage VBCSN is input into the gates of the NMOS transistors LMN7, LMN5, LMN6, and LMN8. The gates of the NMOS transistors LMN3 and LMN1 are coupled to a node NDD1 to which the PMOS transistor LMP1 and the NMOS transistor LMN5 are coupled. The gates of the NMOS transistors LMN2 and LMN4 are coupled to a node NDD2 to which the PMOS transistor LMP2 and the NMOS transistor LMN6 are coupled.

The bandgap reference voltage VBGR is input into the gate of the PMOS transistor LMP1. The feedback voltage VFB is input into the gate of the PMOS transistor LMP2 via a resistor RR1. In addition, a capacitor CC1 is coupled between the gate of the LMP2 and the ground, and the resistor RR1 and the CC1 form a lowpass filter.

The sub-amplifier B includes NMOS transistors LMN9 and LMN10 that form an input differential pair, a NMOS transistor LMN11 that forms a tail current source, and PMOS transistors LMP6 and LMP7 that form loads.

A constant bias voltage VBN is input into the gate of the NMOS transistor LMN11.

A voltage Vo1 at a node NND3, to which the PMOS transistor LMP5 and the NMOS transistor LMN8 are coupled, is input into the gate of the NMOS transistor LMN9.

The source of the PMOS transistor LMP8 is coupled to the power supply voltage VDD, and the reference voltage VREF is output from the drain of the PMOS transistor LMP8. A voltage Vo2 at a node NDD4, to which the PMOS transistor LMP7 and the NMOS transistor LMN10 are coupled, is input into the gate of the PMOS transistor LMP8.

(AMP2)

Figure 5:
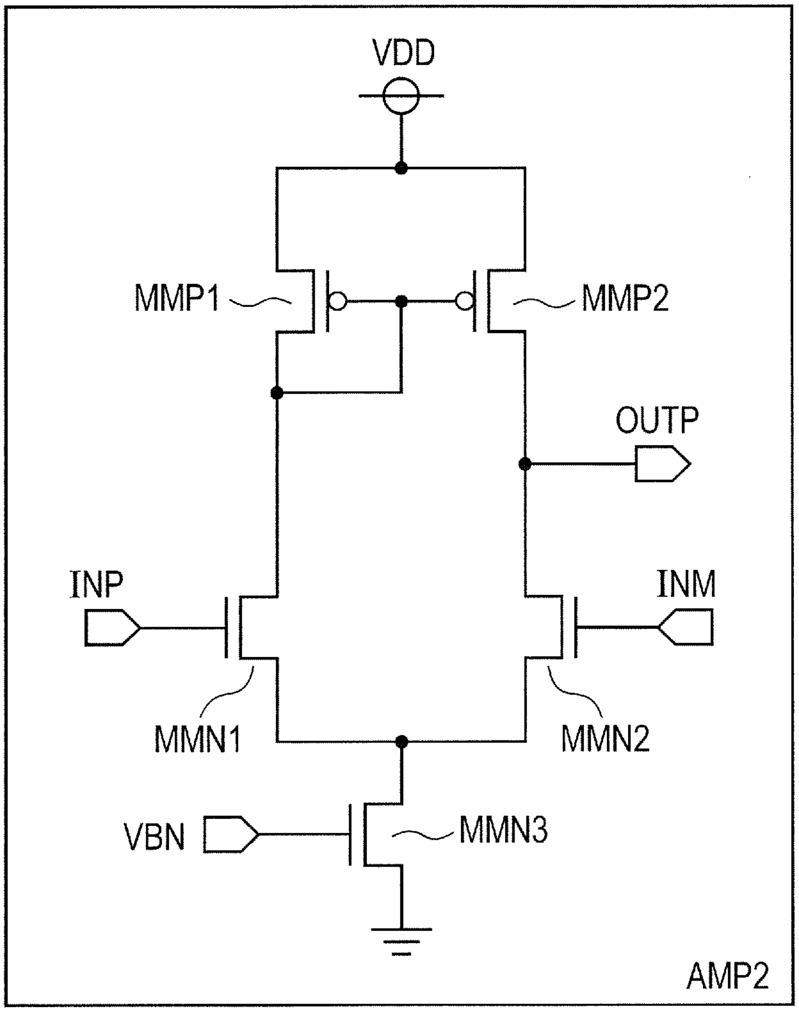
FIG. 5 is a diagram showing the configuration of a feedback amplifier shown in FIG. 3.

FIG. 5 is a diagram showing the configuration of the feedback amplifier AMP2 shown in FIG. 3.

The amplifier AMP2 includes NMOS transistors MMN1 and MMN2 that form an input differential pair, a NMOS transistor MMN3 that form a tail current source, and PMOS transistors MMP1 and MMP2 that form loads.

A constant bias voltage VBN is input into the gate of the NMOS transistor MMN3. The drain voltage INP of the PMOS transistor MP6 shown in FIG. 3 is applied to the gate of the NMOS transistor MMN1. The drain voltage INN of the PMOS transistor MP5 shown in FIG. 3 is applied to the gate of the NMOS transistor MMN2.

A coupled node, to which the PMOS transistor MMP2 and the NMOS transistor MMN2 are coupled, is the output terminal of the amplifier AMP2, and a voltage OUTP is output from the output terminal.

(Description of Correcting Current ICORRECT)

FIG. 6A to FIG. 6E are diagrams that show how to generate a correcting current ICORRECT and explain the magnitude of the correcting current ICORRECT.

Figure 6A:
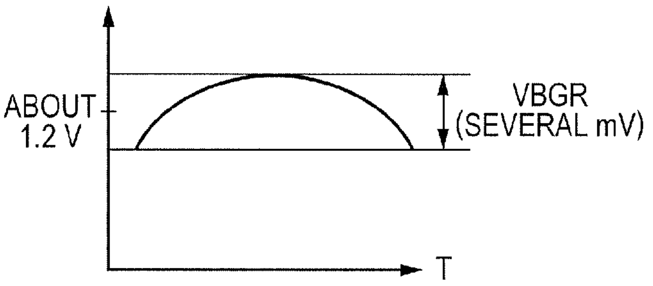
FIG. 6A to FIG. 6E are diagrams that show how to generate a correcting current and explain the magnitude of the correcting current.

FIG. 6A is a diagram showing how the bandgap reference voltage VBGR varies in accordance with temperature T.

As shown in FIG. 6A, the bandgap reference voltage VBGR varies within several millivolts in accordance with temperature.

The primary objective of this embodiment of the present invention is to get rid of this several-millivolt variation of the bandgap reference voltage VBGR in order to make the reference voltage VREF highly accurate.

Figure 6B:
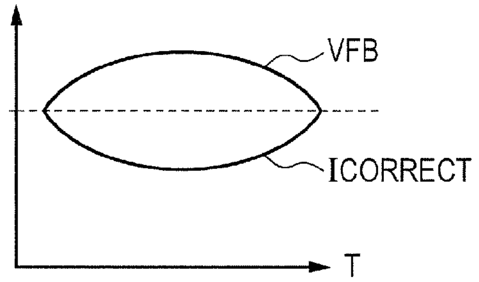

FIG. 6B is a diagram showing the feedback voltage VFB and the correcting current ICORRECT that are both necessary for preventing the reference voltage VREF from varying in accordance with the temperature T.

In order to prevent the reference voltage VREF from varying in accordance with the temperature T, the correcting current ICORRECT to cancel the variation of the feedback voltage VFB based on the temperature T. To put it concretely, with the use of this correcting current ICORRECT and the resistor R4, it is possible to generate a voltage that varies in a direction opposite to the variation of the feedback voltage VFB based on temperature change, with the result that the variation of the reference voltage VREF based on the temperature T can be removed.

In addition, in FIG. 6B, the display range of the correcting current ICORRECT is adjusted by scaling so that it may be matched with the display range of the feedback voltage VFB.

Figure 6C:
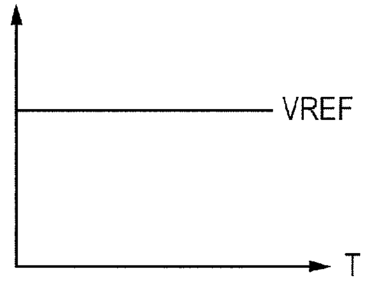

FIG. 6C is a diagram showing the reference voltage VREF output from the regulator that utilizes the bandgap reference voltage VBGR shown in FIG. 6A, and the feedback voltage VFB and the correcting current ICORRECT shown in FIG. 6B.

Figure 6D:
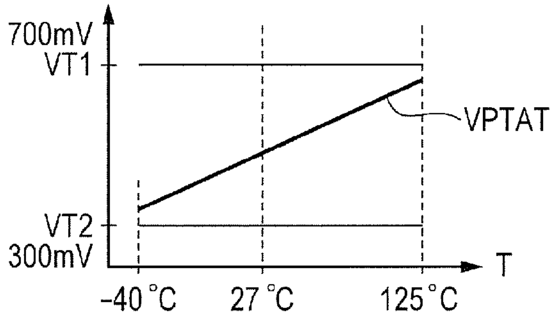

As shown in FIG. 6C, the reference voltage VREF does not vary in accordance with temperature. FIG. 6D is a diagram showing the variations of the voltage VT1, voltage VT2, and voltage VPTAT to temperature change.

As shown in FIG. 6D, the voltage VT1 and voltage VT2 scarcely vary in accordance with temperature. Actually, the voltage VT1 and voltage VT2 vary within several millivolts in the same way as the voltage VBGR. However, because the scale of the vertical axis of FIG. 6D is rougher than that of FIG. 6A or FIG. 6B, the variations of the voltage VT1 and voltage VT2 are inconspicuous.

On the other hand, the voltage VPTAT linearly varies to temperature. The values of the resistors R1, R2, R3, R6, and R7 are adjusted so that the voltage VT1, the voltage VT2, and the voltage VPTAT vary in accordance with temperature in such a way as shown in FIG. 6D.

Figure 6E:
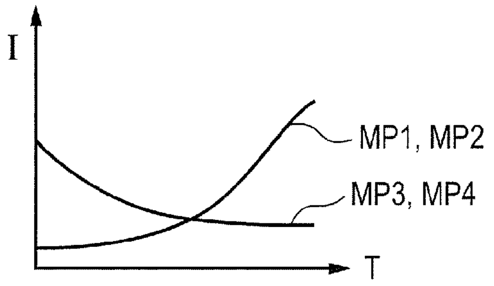

FIG. 6E is a diagram showing the variation of one component of the correcting current ICORRECT flowing through the differential pair transistors MP1 and MP2 in accordance with temperature and the variation of the other component of the correcting current ICORRECT flowing through the differential pair transistors MP3 and MP4 in accordance with temperature.

In the differential pair transistors MP1 and MP2, a current that flows through the PMOS transistor MP2 becomes one component of the correcting current ICORRECT. This is because only the PMOS transistor MP2 is coupled to the node ND5.

Because the value of the voltage VPTAT is lower than that of the voltage VT1 at a low temperature (−40° C.), more current flows through the PMOS transistor MP1 that is applied the voltage VPTAT, and less current flows through the PMOS transistor MP2 that is applied the voltage VT1. Therefore, at the low temperature, one component of the correcting current flowing through the differential pair transistors MP1 and MP2 becomes small.

Because the value of the voltage VPTAT is almost equal to that of the voltage VT1 at a high temperature (125° C.), a current that flows through the PMOS transistor MP1 becomes almost equal to a current that flows through the PMOS transistor MP2. Therefore, at the high temperature, the one component of the correcting current flowing through the differential pair transistors MP1 and MP2 becomes large.

In the differential pair transistors MP3 and MP4, a current that flows through the PMOS transistor MP3 becomes the other component of the correcting current ICORRECT. This is because only the PMOS transistor MP3 is coupled to the node ND5.

Because the value of the voltage VPTAT is almost equal to that of the voltage VT1 at a low temperature (−40° C.), a current that flows through the PMOS transistor MP3 becomes almost equal to a current that flows through the PMOS transistor MP4. Therefore, at the low temperature, the other component of the correcting current flowing through the differential pair transistors MP3 and MP4 becomes large.

Because the value of the voltage VPTAT is higher than that of the voltage VT1 at a high temperature (120° C.), less current flows through the PMOS transistor MP3 that is applied the voltage VPTAT, and more current flows through the PMOS transistor MP4 that is applied the voltage VT2. Therefore, at the high temperature, one component of the correcting current flowing through the differential pair transistors MP3 and MP4 becomes small.

The one component of the correcting current that flows through the differential pair transistors MP1 and MP2 and the other component of the correcting current that flows through the differential pair transistors MP3 and MP4 add up to the correcting current ICORRECT shown in FIG. 6B.

As described above, this embodiment makes it possible that an appropriate correction, which takes the temperature characteristics of the BGR circuit 4 and the regulator 6 into consideration, is achieved because the correcting current ICORRECT, which is generated by the temperature-characteristics correcting circuit 2 in accordance with the voltage VPTAT depending on the temperature in the BGR circuit 4, is fed back to the regulator.

Second Embodiment

Figure 7:
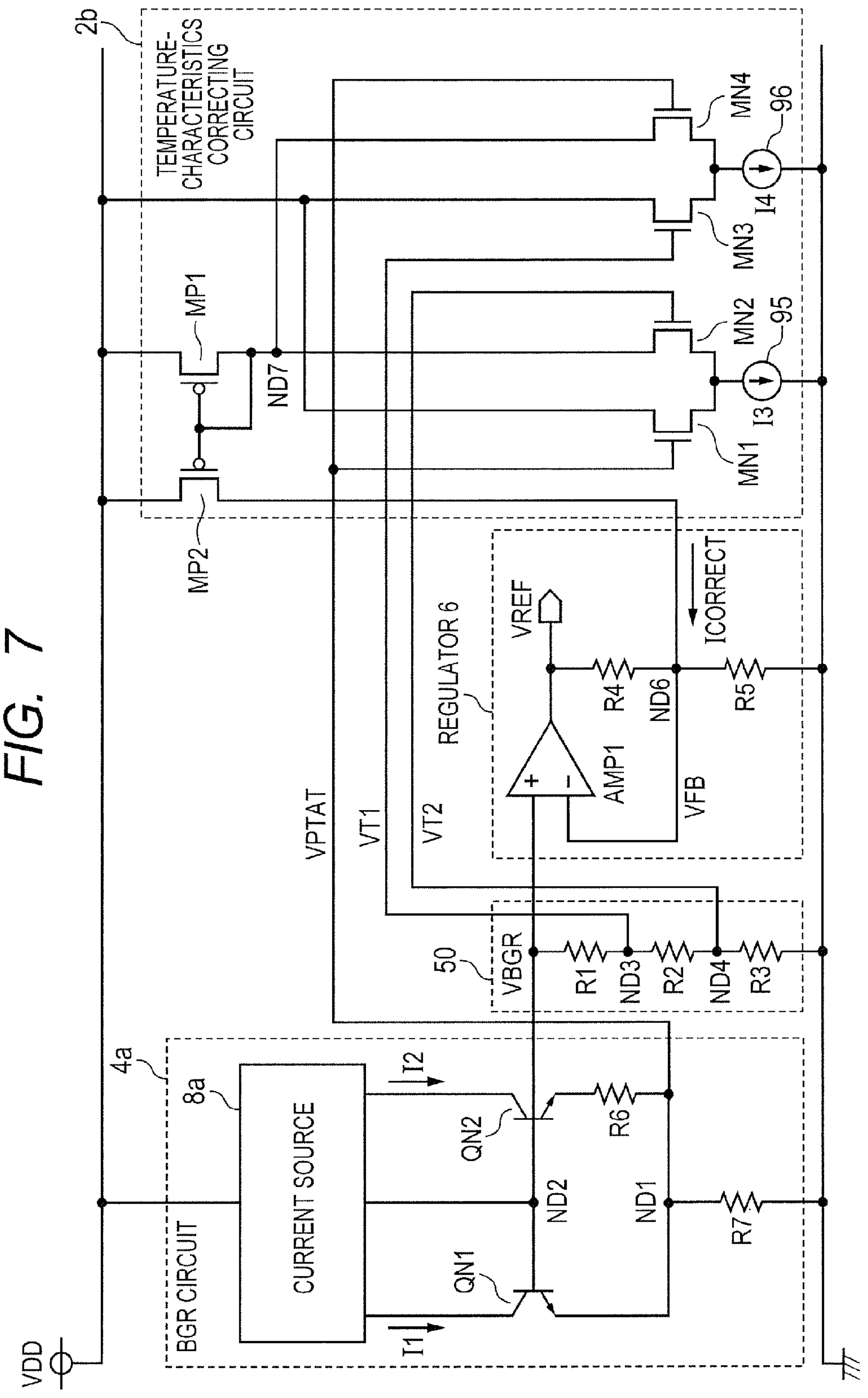
FIG. 7 is a diagram showing the configuration of a reference voltage generating circuit according to a second embodiment.

FIG. 7 is a diagram showing the configuration of a reference voltage generating circuit according to a second embodiment.

This reference voltage generating circuit is different from the reference voltage generating circuit shown in FIG. 3 in that a temperature-characteristics correcting circuit 2*b* of this circuit is different from the temperature-characteristics correcting circuit 2*a* shown in FIG. 3.

The temperature-characteristics correcting circuit 2*b* includes NMOS transistors MN1 and MN2 that forms a first differential pair, NMOS transistors MN3 and MN4 that forms a second differential pair, and PMOS transistors MP1 and MP2 that form a current mirror circuit.

A current source 95 outputs a tail current I3. The current source 95 can be also formed by an NMOS transistor that forms a current mirror circuit along with a PMOS transistor MP6 included in a current source 8*a*.

A current source 96 outputs a tail current I4. The current source 96 can be also formed by an NMOS transistor that forms a current mirror circuit along with a PMOS transistor MP6 included in the current source 8*a*.

The gate of the NMOS transistor MN1 and the gate of the NMOS transistor MN4 receive a voltage VPTAT that linearly varies to temperature.

The gate of the NMOS transistor MN2 receives a low voltage VT2 that scarcely vary in accordance with temperature. The gate of the NMOS transistor MN3 receives a high voltage VT1 that scarcely vary in accordance with temperature.

The source of the NMOS transistor MN1 and the source of the NMOS transistor MN2 are coupled to the current source 95. The source of the NMOS transistor MN3 and the source of the NMOS transistor MN4 are coupled to the current source 96.

The drain of the NMOS transistor MN1 and the drain of the NMOS transistor MN3 are coupled to the power supply voltage VDD. The drain of the NMOS transistor MN2 and the drain of the NMOS transistor MN4 are coupled to a node ND7.

The drain and gate of the PMOS transistor MP1 at the input side of the current mirror circuit is coupled to the node ND7. The source of the PMOS transistor MP1 is coupled to the power supply voltage VDD.

The drain of the PMOS transistor MP2 at the output side of the current mirror circuit is coupled to a node ND6. The source of the PMOS transistor MP2 is coupled to the power supply voltage VDD, and the gate is coupled to the node ND7.

As described above, in a similar way to the first embodiment, this embodiment makes it possible that an appropriate correction, which takes the temperature characteristics of a BGR circuit 4*a* and a regulator 6 into consideration, is achieved.

Third Embodiment

Figure 8:
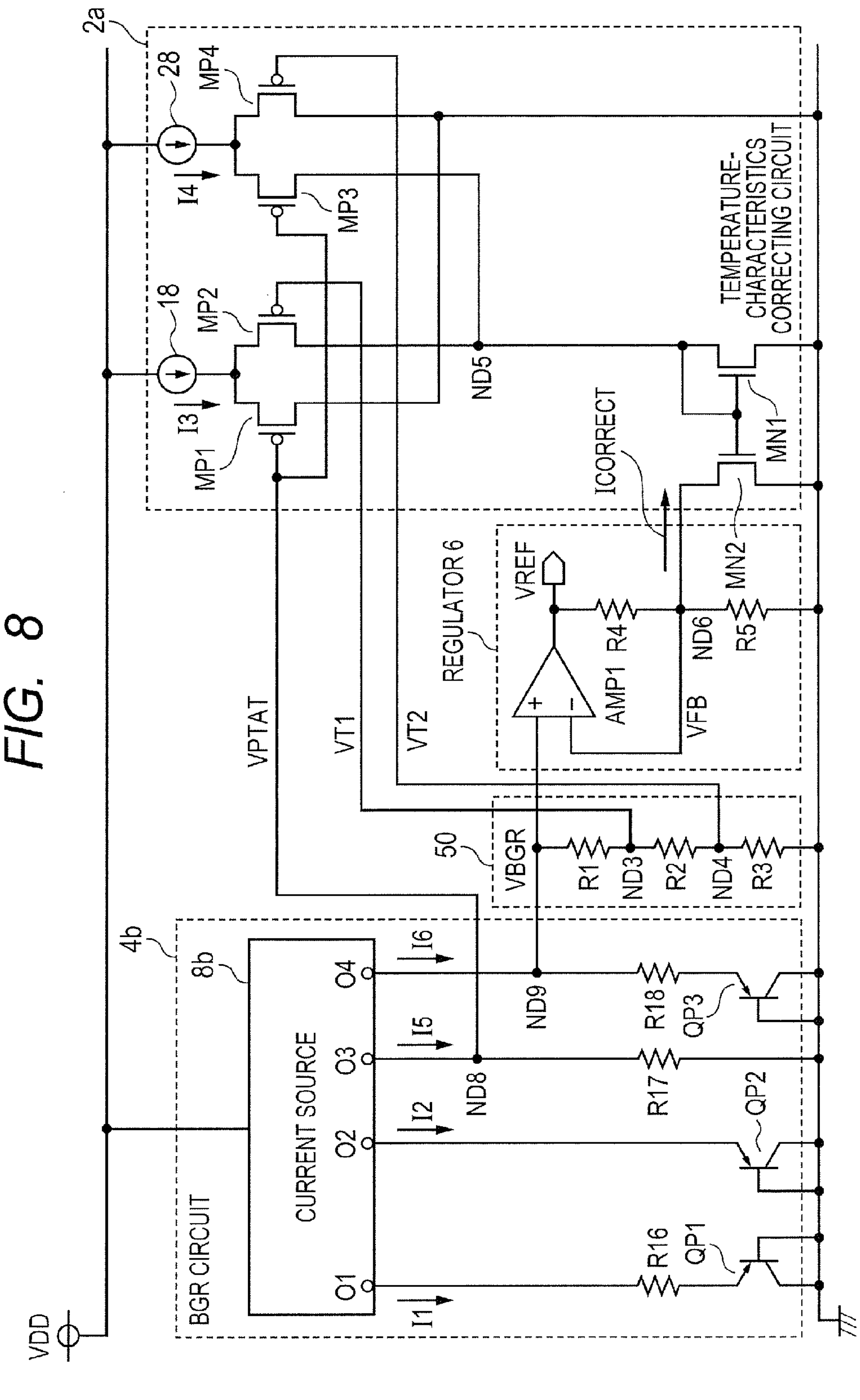
FIG. 8 is a diagram showing the configuration of a reference voltage generating circuit according to a third embodiment.

FIG. 8 is a diagram showing the configuration of a reference voltage generating circuit according to a third embodiment.

This reference voltage generating circuit is different from the reference voltage generating circuit shown in FIG. 3 in that a BGR circuit 4*b* of this circuit is different from the BGR circuit 4*a* shown in FIG. 3.

Here, it will be assumed that a current source 18 and a current source 28 shown in FIG. 8 are respectively the same as the PMOS transistor MP7 and the PMOS transistor MP8 shown in FIG. 3.

The BGR circuit 4*b* includes a current source 8*b*, a resistor R16 and a PNP bipolar transistor QP1 disposed in series between a first terminal O1 of the current source 8*b* and the ground, a PNP bipolar transistor QP2 disposed between a second terminal O2 of the current source 8*b* and the ground, a resistor R17 disposed between a third terminal O3 of the current source 8*b* and the ground, and a resistor R18 and a PNP bipolar transistor QP3 disposed in series between a fourth terminal O4 of the current source 8*b* and the ground.

The current source 8*b* outputs currents I1, I2, I5, and I6 from a first terminal O1, a second terminal O2, a third terminal O3, and a fourth terminal O4 respectively.

The current source 8*b* outputs the current I1 the value of which is determined in accordance with the size of the bipolar transistor QP1 and the value of the resistor R16. The current source 8*b* also outputs the current I2 the value of which is determined in accordance with the size of the bipolar transistor QP2. In addition, the current source 8*b* generates the current I5 and the current I6 using an embedded current mirror circuit with reference to the current I1. In this embodiment, it will be assumed that the current I1, I2, I5, and I6 are all equal for convenience of description hereinafter.

The base terminals of the bipolar transistors QP1, QP2, and QP3 are coupled to the ground.

The current I1 output from the current source 8*b* is input into the emitter terminal of the bipolar transistor QP1 via the resistor R16. A current output from the collector terminal of the bipolar transistor QP1 flows into the ground.

The current I2 output from the current source 8*b* is input into the emitter terminal of the bipolar transistor QP2. A current output from the collector terminal of the bipolar transistor QP2 flows into the ground.

The resistor R17 is disposed between a node ND8 and the ground. The current I5 output from the current source 8*b* is sent to the node ND8. A current input into the node ND8 flows into the ground via the resistor R 17. A voltage at the node ND8 corresponds to the voltage VPTAT described in the first embodiment, hence it will be referred to as the voltage VPTAT hereinafter. The voltage VPTAT is sent to a temperature-characteristics correcting circuit 2*a*.

The resistor R18 is disposed between a node ND9 and the emitter terminal of the bipolar transistor QP3. The current I6 output from the current source 8*b* is sent to the node ND9. Part of the current input into the node ND9 is input into the emitter terminal of the bipolar transistor QP3 via the resistor R18. A current output from the collector terminal of the bipolar transistor QP3 flows into the ground. The remaining part of the current input into the node ND9 flows into a voltage dividing circuit 50. A voltage at the node ND9 corresponds to the bandgap reference voltage VBGR described in the first embodiment, hence it will be referred to as the voltage VPTAT hereinafter.

With the use of thus generated voltages VPTAT and VBGR, components other than those in the BGR circuit in this reference voltage generating circuit operate in a similar way to corresponding components in the first embodiments respectively. The voltage VPTAT is determined by the current I5 and the resistor R17, and varies in accordance with temperature.

As described above, in a similar way to the first embodiment, this embodiment makes it possible that an appropriate correction, which takes the temperature characteristics of a BGR circuit 4*b* and a regulator 6 into consideration, is achieved.

Fourth Embodiment

Figure 9:
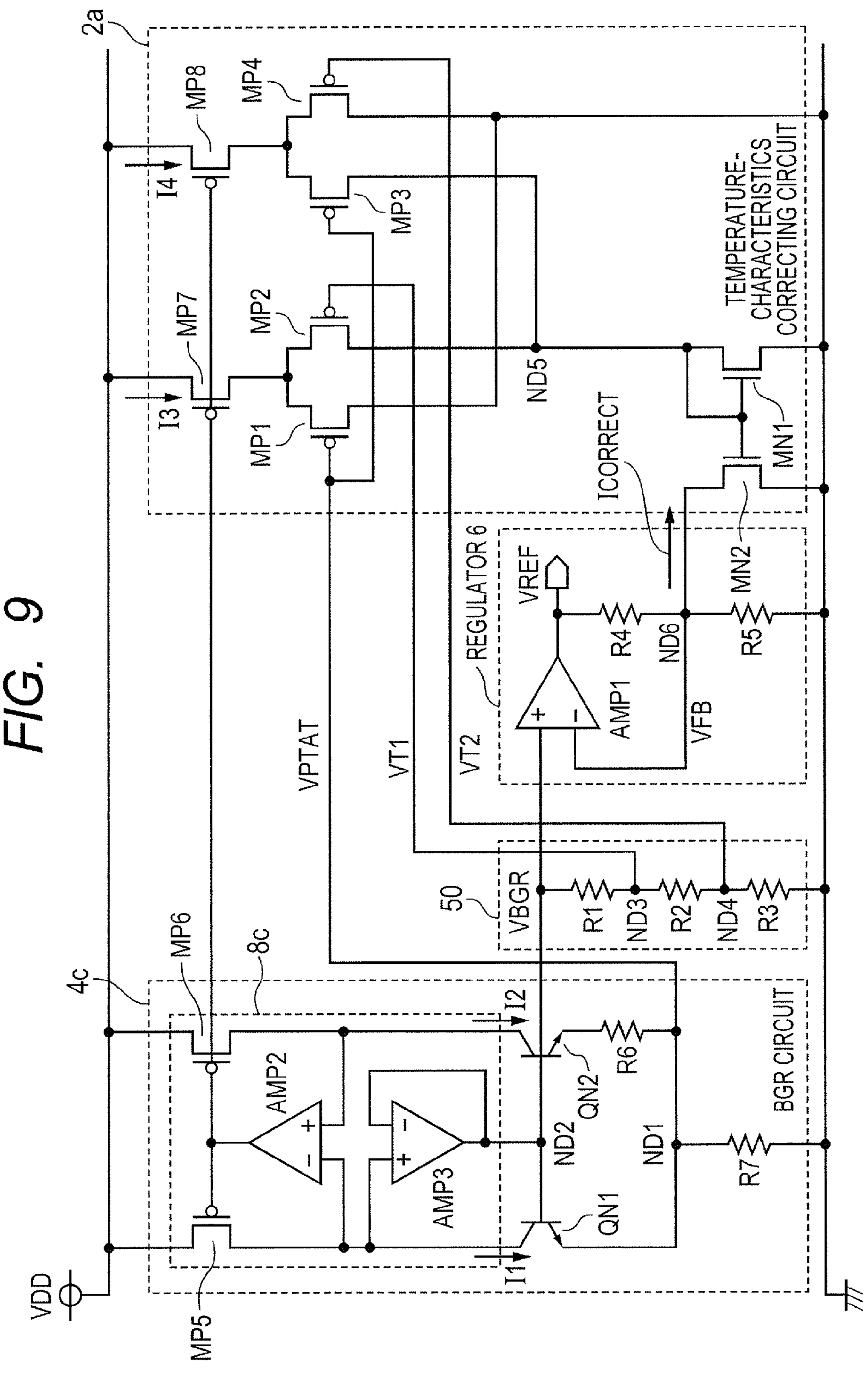
FIG. 9 is a diagram showing the configuration of a reference voltage generating circuit according to a fourth embodiment.

FIG. 9 is a diagram showing the configuration of a reference voltage generating circuit according to a fourth embodiment.

This reference voltage generating circuit is different from the reference voltage generating circuit shown in FIG. 3 in that a BGR circuit 4*c* of this circuit is different from the BGR circuit 4*a* shown in FIG. 3.

The BGR circuit 4*c* includes an amplifier AMP3 forming a voltage follower instead of the NMOS transistor MN3 forming a source follower shown in FIG. 3.

The positive input terminal of the amplifier AMP3 is coupled to the drain of a PMOS transistor MP5 and the collector terminal of a bipolar transistor QN1. The output terminal of the amplifier AMP3 is coupled to the negative input terminal of the amplifier AMP3 as well as to a node ND2.

The configuration of the amplifier AMP3 is similar to that of the amplifier AMP2 described in FIG. 5. The reference voltage generating circuit according to this embodiment can operate with a lower operating voltage than the reference voltage generating circuit according to the first embodiment owing to the voltage follower used in this embodiment in stead of the NMOS transistor MN3 used in the first embodiment.

Fifth Embodiment

Figure 10:
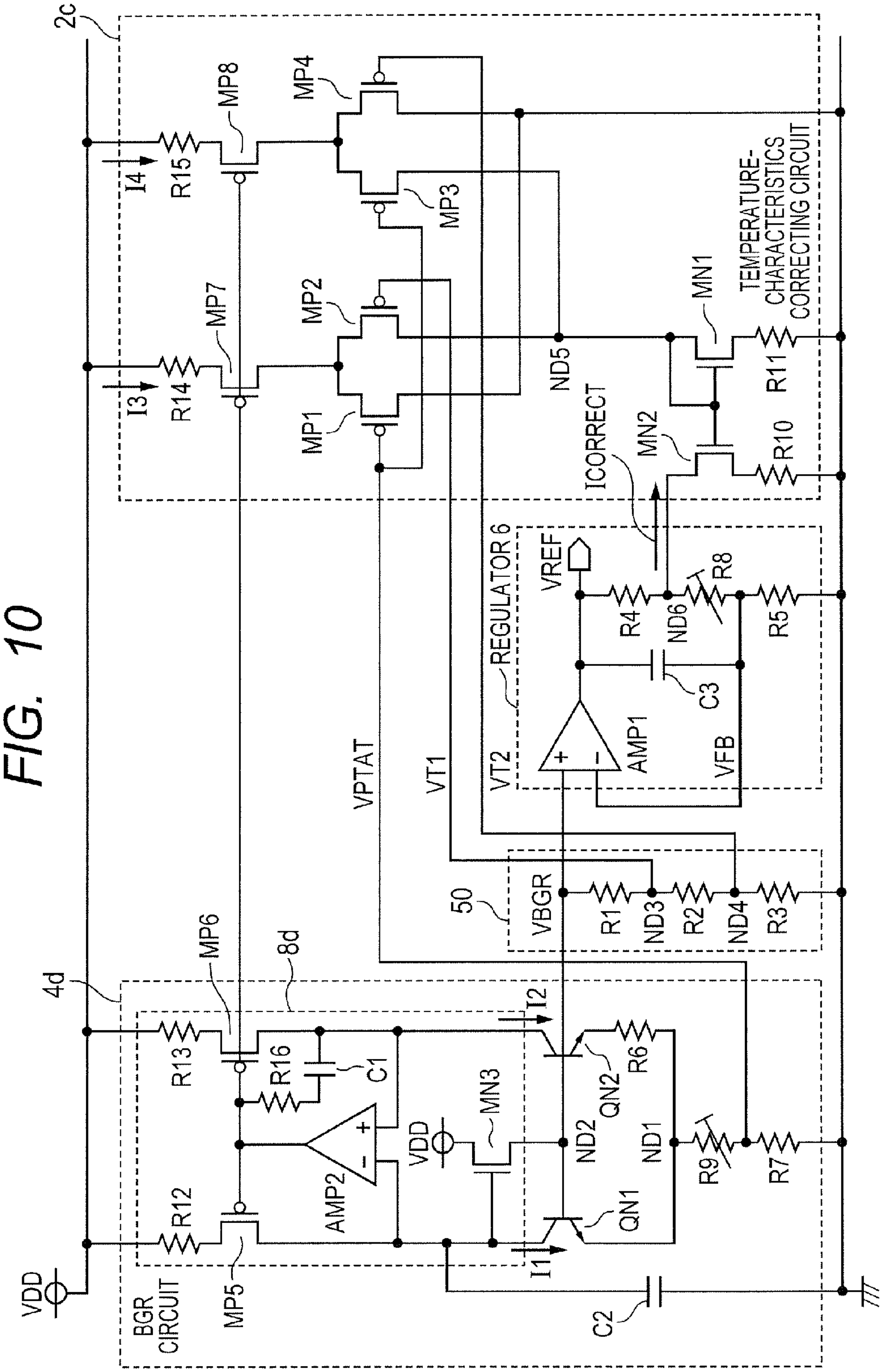
FIG. 10 is a diagram showing the configuration of a reference voltage generating circuit according to a fifth embodiment.

FIG. 10 is a diagram showing the configuration of a reference voltage generating circuit according to a fifth embodiment.

This reference voltage generating circuit is different from the reference voltage generating circuit shown in FIG. 3 in that a BGR circuit 4*d* and a temperature-characteristics correcting circuit 2*c* of this circuit is different from the BGR circuit 4*a* and the temperature-characteristics correcting circuit 2*a* shown in FIG. 3.

Several resistors and capacitors are added to the BGR circuit 4*d* and the temperature-characteristics correcting circuit 2*c* in order to improve the characteristics of these circuits.

To put it concretely, degeneration resistors R11, R10, R12, R13, R14, and R15 are coupled to the sources of transistors MN1, MN2, MP5, MP6, MP7, and MP8, respectively. These resistors are useful for reducing mismatches between currents in the current mirror circuits owing to variations between the thresholds of the transistors MN1 and MN2, MN5 and MN6, and MN7 and MN8.

In addition, a trimming resistor R8 is disposed between a resistor R4 and a resistor R5, and a trimming resistor R9 is disposed between a resistor R6 and a resistor R7. By adjusting values of the trimming resistors R8 and R9, the accuracies of a bandgap reference voltage VBGR and a reference voltage VREF shown in FIG. 10 can be improved. The reference voltage generating circuit according to this embodiment is configured in such a way that a voltage VPTAT and a correcting current ICCORECT shown in FIG. 10 do not vary in accordance with the values of these trimming resistors. The above-described configuration of the reference voltage generating circuit according to this embodiment also makes it possible that the improvement of trimming accuracy and the easiness of trimming code calculation are achieved at the same time.

In addition, in order to correct the phase characteristics of an amplifier AMP2, a resistor R16, a capacitor C1, and a capacitor C2 are added around the periphery of the amplifier AMP2, and a capacitor C3 is added at an amplifier AMP1. By implementing these components, the stability of the signal loop within the reference voltage generating circuit can be improved.

Here, the sizes of the transistors and the values of the resistors, which lead to a proper operation of the reference voltage generating circuit shown in FIG. 10, will be cited below as an example.

In this case, the values of the resistors R1 to R15 are respectively 183 kΩ, 137 kΩ, 108 kΩ, 55 kΩ, 616 kΩ, 53 kΩ, 220 kΩ, 63.5 kΩ, 62 kΩ, 80 kΩ, 80 kΩ, 400 kΩ, 400 kΩ, 400 kΩ, and 400 kΩ.

In addition, it will be assumed that the ratio between the size of the transistor QN1 and the size of the transistor QN2 is one to eight. It will be assumed that the sizes of other transistors are the same.

It should be understood that the embodiments disclosed above are illustrative and not restrictive in all respects. The scope of the invention is defined by the claims rather than by the above description and all changes that fall within meets and bounds of the claims or equivalence of such meets and bounds are intended to be within the scope of the invention.

What is claimed is:

1. A reference voltage generating circuit comprising:

a bandgap reference circuit that outputs a bandgap reference voltage;

a voltage dividing circuit that generates a first voltage and a second voltage obtained by dividing the bandgap reference voltage;

a regulator that amplifies the bandgap reference voltage, the regulator including a differential amplifier, a first resistor and a second resistor that are coupled in series between the output of the differential amplifier and the ground, wherein a first input terminal of the differential amplifier receives the bandgap reference voltage, a second input terminal is coupled to a coupled node between the first resister and the second resistor, and the bandgap reference circuit further outputs a third voltage that varies in accordance with a temperature determined by a predetermined amount of current flowing in the bandgap reference circuit and a predetermined resistor in the bandgap reference circuit; and a correcting circuit that controls a correcting current flowing through the coupled node so that the magnitude of the correcting current varies in accordance with the difference between the third voltage and the first voltage, and the difference between the third voltage and the second voltage.

2. The reference voltage generating circuit according to claim 1, wherein the correcting circuit comprising:

a first tail current source;

transistors of a first differential pair that are coupled to the first tail current source;

a second tail current source;

transistors of a second differential pair that are coupled to the second tail current source; and a current mirror circuit including an input-side transistor and an output-side transistor, wherein the control electrode of one transistor of the first differential pair receives the third voltage, and the control electrode of the other transistor of the first differential pair receives the first voltage, the control electrode of one transistor of the second differential pair receives the third voltage, and the control electrode of the other transistor of the second differential pair receives the second voltage, the input-side transistor is coupled to the other transistor of the first differential pair and the one transistor of the second differential pair, and the output-side transistor is coupled to the coupled node.

3. The reference voltage generating circuit according to claim 2, wherein the first tail current source and the second tail current source are coupled to an operating power supply voltage;

the transistors of the first differential pair and the transistors of the second differential pair are PMOS transistors, and the input-side transistor and the output-side transistor are NMOS transistors; and the one transistor of the first differential pair and the other transistor of the second differential pair are coupled to the ground.

4. The reference voltage generating circuit according to claim 2, wherein the first tail current source and the second tail current source are coupled to the ground;

the transistors of the first differential pair and the transistors of the second differential pair are NMOS transistors, and the input-side transistor and the output-side transistor are PMOS transistors; and the one transistor of the first differential pair and the other transistor of the second differential pair are coupled to an operating power supply voltage.

5. The reference voltage generating circuit according to claim 1, wherein the bandgap reference circuit includes:

a current source that outputs a first current and a second current that have the same value;

a first NPN bipolar transistor that has a collector terminal into which the first current is input;

a second NPN bipolar transistor that has a collector terminal into which the second current is input, wherein the base terminal of the first NPN bipolar transistor and the base terminal of the second NPN bipolar transistor are coupled to each other;

a third resistor that has one terminal coupled to the emitter terminal of the second NPN bipolar transistor; and a fourth resistor that is coupled to the emitter terminal of the first NPN bipolar transistor and the other terminal of the third resistor, wherein the bandgap reference voltage is the base voltage of the first NPN bipolar transistor, that is, the base voltage of the second NPN bipolar transistor, the predetermined amount of current is the sum of the first current and the second current, the predetermined resistor is the fourth resistor, and the third voltage is the voltage at the coupled node between the third resistor and the fourth resistor.

6. The reference voltage generating circuit according to claim 5, wherein the current source includes:

a first PMOS transistor disposed between the operating power supply voltage and the collector terminal of the first NPN bipolar transistor;

a second PMOS transistor disposed between the operating power supply voltage and the collector terminal of the second NPN bipolar transistor;

a feedback amplifier that has one input terminal coupled to the collector terminal of the first NPN bipolar transistor, the other input terminal coupled to the collector terminal of the second NPN bipolar transistor, and an output terminal coupled to the control electrode of the first PMOS transistor and to the control electrode of the second PMOS transistor; and an NMOS transistor that is disposed between the operating power supply voltage and the base terminals of the first NPN bipolar transistor and the second NPN bipolar transistor and that has a control electrode coupled to the collector terminal of the first NPN bipolar transistor.

7. The reference voltage generating circuit according to claim 5, wherein the current source includes:

a first PMOS transistor disposed between an operating power supply voltage and the collector terminal of the first NPN bipolar transistor;

a second PMOS transistor disposed between the operating power supply voltage and the collector terminal of the second NPN bipolar transistor;

a feedback amplifier that has one input terminal coupled to the collector terminal of the first NPN bipolar transistor, the other input terminal coupled to the collector terminal of the second NPN bipolar transistor, and an output terminal coupled to the control electrode of the first PMOS transistor and to the control electrode of the second PMOS transistor; and a voltage follower that has one input terminal coupled to the collector terminal of the first NPN bipolar transistor, and the other input terminal and an output terminal that are coupled to each other, wherein the output terminal is coupled to the base terminal of the first NPN bipolar and to the base terminal of the second NPN bipolar.

8. The reference voltage generating circuit according to claim 1, wherein the bandgap reference circuit includes:

a current source that outputs a first current, a second current, a third current, and a fourth current from a first terminal, a second terminal, a third terminal, and a fourth terminal respectively, wherein the first current, the second current, the third current, and the fourth current are proportional to each other;

a third resistor and a first PNP bipolar transistor coupled in series between the first terminal and the ground;

a second PNP bipolar transistor disposed between the second terminal and the ground;

a fourth resistor disposed between the third terminal and the ground;

a fifth resistor and a third PNP bipolar transistor coupled in series between the fourth terminal and the ground, wherein the bandgap reference voltage is a voltage at the fourth terminal, the predetermined amount of current is the third current, the predetermined resistor is the fourth resistor, and the third voltage is a voltage at the third terminal.

* * * * *